(12) United States Patent  (10) Patent No.: US 8,049,558 B2
Wyse et al.  (45) Date of Patent: Nov. 1, 2011

(54) SWITCHABLE BALANCED AMPLIFIER

(75) Inventors: Russell Wyse, Center Pt., IA (US);
James P. Young, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 18 days.

(21) Appl. No.: 12/666,570

(22) PCT Filed: Jul. 7, 2008

(86) PCT No.: PCT/US2008/069350
§ 371 (c)(1),
(2), (4) Date: Dec. 23, 2009

(87) PCT Pub. No.: WO2009/009494
PCT Pub. Date: Jan. 15, 2009

(65) Prior Publication Data
US 2011/0006841 A1 Jan. 13, 2011

Related U.S. Application Data

(60) Provisional application No. 60/958,628, filed on Jul. 7, 2007.

(51) Int. Cl.
*H03F 3/68* (2006.01)
(52) U.S. Cl. .................................................. 330/124 R
(58) Field of Classification Search ............. 330/124 R, 330/295
See application file for complete search history.

(56) References Cited

U.S. PATENT DOCUMENTS 5,101,171 A * 3/1992 Redmond ................. 330/124 R

* cited by examiner

*Primary Examiner* — Steven J Mottola
(74) *Attorney, Agent, or Firm* — Lando & Anastasi, LLP

(57) ABSTRACT

A switchable balanced amplifier having multiple, configurable independent input/output paths. Switching networks coupled to the input and/or output quadrature couplers of the balanced amplifier are used to configurably direct any of one or more input signals to any of one or more output ports. In one example, each output port is coupled to circuitry tailored to a specific type of input signal, operating protocol and/or operating frequency band.

22 Claims, 12 Drawing Sheets

SWITCHABLE BALANCED AMPLIFIER

CROSS REFERENCE TO RELATED APPLICATIONS

This application claims priority to co-pending U.S. Provisional Patent Application No. 60/958,628 entitled "SWITCHABLE BALANCED AMPLIFIER," filed Jul. 7, 2007, which is incorporated herein by reference in its entirety.

BACKGROUND

1. Field of Invention

The present invention relates generally to electrical circuits and systems and, more particularly, to balanced amplifier circuits.

2. Discussion of Related Art

A balanced amplifier typically has one input port and one output port. For example, referring to FIG. 1, there is illustrated an example of a conventional balanced amplifier having a single radio frequency (RF) input 102 and a single RF output 104. The balanced amplifier comprises two chains of amplifiers 106a and 106b that are run in quadrature, that is, operating 90 degrees apart in phase. A quadrature coupler (or splitter) 108 on the RF input 102 phase-shifts the signal 90 degrees at the amplifier inputs, and a second quadrature coupler 110 on the output 104 reverses the phase shift so that the signals at the amplifier outputs combine in phase.

In some circumstances, it is desirable for a single balanced amplifier to support multiple applications, different power requirements, different modes of operation, different input and/or output filtering, or different antennae. Conventional solutions for using a single balanced amplifier in multiple modes, operating frequency bands, power settings or applications can require complicated and lossy input and output path switching or load line switching. This adds to the size and complexity of the circuit, which is often undesirable.

SUMMARY OF INVENTION

Aspects and embodiments of the invention are directed to a switchable balanced amplifier having multiple, configurable independent input/output paths. Switching networks coupled to the input and/or output quadrature couplers of the balanced amplifier are used to configurably direct any of one or more input signals to any of one or more output ports. Each output port can be coupled to circuitry tailored to a specific type of input signal, operating protocol and/or operating frequency band, as discussed further below.

According to one aspect, a switchable balanced amplifier comprises an input quadrature coupler having a first port and a second port, an output quadrature coupler having a first port and a second port, and an amplifier stage electrically coupled between the input quadrature coupler and the output quadrature coupler. Each of the first port and the second port of at least one of the input quadrature coupler and the output quadrature coupler is switchably connected to one of a termination load and at least one signal terminal.

In one example of the switchable balanced amplifier, each of the first and second ports of the input quadrature coupler is switchably connected to one of an input termination load and at least one input signal terminal by respective first and second input switches. In another example, each of the first and second ports of the output quadrature coupler are switchably connected to one of an output termination load and at least one output signal terminal by respective first and second output switches. The first and second input and/or switches may be, for example, single-pole double-throw switches, or any other type of suitable switching mechanism known to those skilled in the art. In one example, the at least one output signal terminal that is switchably connected to the first port of the output quadrature coupler is electrically coupled to first output circuitry optimized for a first operating mode, and the at least one output signal terminal that is switchably connected to the second port of the output quadrature coupler is electrically coupled to second output circuitry optimized for a second operating mode, different than the first operating mode. Similarly, the at least one input signal terminal that is switchably connected to the first port of the input quadrature coupler may be electrically coupled to first input circuitry optimized for a first operating mode, and the at least one input signal terminal that is switchably connected to the second port of the input quadrature coupler may be electrically coupled to second input circuitry optimized for a second operating mode, different than the first operating mode. In another example, the at least one signal terminal includes a plurality of signal terminals, and each of the first port and the second port of at least one of the input quadrature coupler and the output quadrature coupler is switchably connected to one of the termination load and one of the plurality of signal terminals. In another example, the switchable balanced amplifier further comprises input switching means configured to switchably connect the first and second ports of the input quadrature coupler to one of the termination load and the at least one signal terminal. The switchable balanced amplifier may also comprise output switching means configured to switchably connect each of the first and second ports of the output quadrature coupler to one of the termination load and the at least one signal terminal. In another example in which the at least one signal terminal includes a plurality of signal terminals, the output switching means is configured to connect one of the first and second ports of the output quadrature coupler to the termination load and the other of the first and second ports of the output quadrature coupler to one of the plurality of signal terminals. In a further example, the plurality of signal terminals includes a first signal terminal and a second signal terminal, and the first signal terminal is coupled to first output circuitry optimized for a first operating mode, and the second signal terminal is coupled to second output circuitry optimized for a second operating mode, different than the first operating mode.

Another aspect is directed to a method of configuring a balanced amplifier. According to one embodiment, the method comprises at least one of: a) switchably connecting each of a first input port of the balanced amplifier and a second input port of the balanced amplifier to one of an input termination load and at least one input signal terminal; and b) switchably connecting each of a first output port of the balanced amplifier and a second output port of the balanced amplifier to one of an output termination load and at least one output signal terminal. In one example, the method includes both acts a) and b).

In one example in which the at least one input signal terminal includes a plurality of input signal terminals, switchably connecting each of the first and second input ports of the balanced amplifier to one of the input termination load and the at least one input signal terminal includes switchably connecting each of the first and second input ports to one of the input termination load and a selected one of the plurality of input signal terminals. In another example in which the at least one output signal terminal includes a plurality of output signal terminals, switchably connecting each of the first and second output ports of the balanced amplifier to one of the output termination load and the at least one output signal terminal includes selecting one of the plurality of output signal terminals, and switchably connecting each of the first and second output ports of the balanced amplifier to one of the output termination load and the selected one of the plurality of output signal terminals. In another example, selecting one of the plurality of output signal terminals is performed responsive to switchably connecting each of the first and second input ports of the balanced amplifier to one of the input termination load and the at least one input signal terminal. In one example, in which the at least one input signal terminal includes a plurality of input signal terminals, switchably connecting each of the first and second input ports to one of the input termination load and the at least one input signal terminal includes selecting one of the plurality of input signal terminals, and switchably connecting each of the first and second input ports to one of the input termination load and the selected one of the plurality of input signal terminals. Selecting one of the plurality of output signal terminals may be performed responsive to selecting one of the plurality of input signal terminals. Furthermore, switchably connecting each of the first and second output ports of the balanced amplifier to one of the output termination load and the at least one output signal terminal may be performed responsive to switchably connecting each of the first and second input ports of the balanced amplifier to one of the input termination load and the at least one input signal terminal. In another example, switchably connecting each of the first input port of the balanced amplifier and the second input port of the balanced amplifier to one of the input termination load and the at least one input signal terminal includes switchably connecting the first input port of the balanced amplifier to the input termination load and switchably connecting the second input port of the balanced amplifier to the at least one input signal terminal. Switchably connecting each of the first output port of the balanced amplifier and the second output port of the balanced amplifier to one of the output termination load and the at least one output signal terminal may similarly include switchably connecting the first output port of the balanced amplifier to the output termination load and switchably connecting the second output port of the balanced amplifier to the at least one output signal terminal.

According to another aspect, a switchable balanced amplifier comprises an input quadrature coupler having a first input and a second input, an output quadrature having a first output and a second output, a balanced amplifier stage electrically coupled between the input quadrature coupler and the output quadrature coupler, an input switching network electrically coupled to the first and second inputs and configured to switchably connect one of the first and second inputs to an input termination load and the other of the first and second inputs to at least one input signal terminal, and an output switching network electrically coupled to the first and second outputs and configured to switchably connect one of the first and second outputs to an output termination load and the other of the first and second outputs to at least one output terminal.

According to another aspect, a switchable balanced amplifier comprises a first input port, a second input port, an output port, an amplifier stage coupled between the first and second input ports and the output port, a first input switch configured to switchably couple the first input port to one of a first signal input and an input termination load, and a second input switch configured to switchably couple the second input port to one of a second signal input and the input termination load, wherein, during operation of the switchable balanced amplifier, one of the first and second input ports is coupled to the input termination load.

In one example, the first and second input switches are single-pole double-throw switches. In another example, the output port comprises a first output port and a second output port; and the further switchable balanced amplifier comprises a first output switch configured to switchably couple the first output port to one of a first signal output and an output termination load, and a second output switch configured to switchably couple the second output port to one of a second signal output or the output termination load, wherein, during operation of the switchable balanced amplifier, one of the first and second output ports is coupled to the output termination load. In one example, the first and second input ports are ports of an input quadrature coupler and the first and second output ports are ports of an output quadrature coupler. The amplifier stage is coupled between the input quadrature coupler and the output quadrature coupler.

Another aspect is directed to a switchable balanced amplifier comprising an input quadrature coupler having a first port and a second port, an output quadrature coupler having a first port and a second port, and an amplifier stage electrically coupled between the input quadrature coupler and the output quadrature coupler. The switchable balanced amplifier further comprises a first input terminal switchably connected to the first port of the input quadrature coupler, a second input terminal switchably connected to the second port of the input quadrature coupler, a first output terminal switchably coupled to the first port of the output quadrature coupler, and a second output terminal switchably coupled to the second port of the output quadrature coupler. In one example, the first and second ports of the input quadrature coupler are further switchably coupled to a respective input termination load. Similarly, the first and second ports of the output quadrature coupler may be switchably coupled to a respective output termination load.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

In many industries, including the wireless communications industry, there is an ever-present drive toward smaller and more complex devices such as, for example, smaller cellular telephones, computers or personal digital assistants (PDAs) that have more features and capability. In these and other applications, it may be desirable for a single component, such as an amplifier, to be capable of different operating characteristics to accommodate different operating modes and/or operating frequency bands of the device in which it is used. Accordingly, aspects and embodiments are directed to a balanced amplifier with configurable input port and output port characteristics. As discussed in further detail below, in one embodiment a "switchable" balanced amplifier is configurable to have different, separate output ports to achieve, for example, different load lines and/or different output power characteristics. In another embodiment, a switchable balanced amplifier has configurable input and output ports than can be altered to provide multiple input and output paths to achieve, for example, reduced complexity switching, filtering and/or antenna routing, as also discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
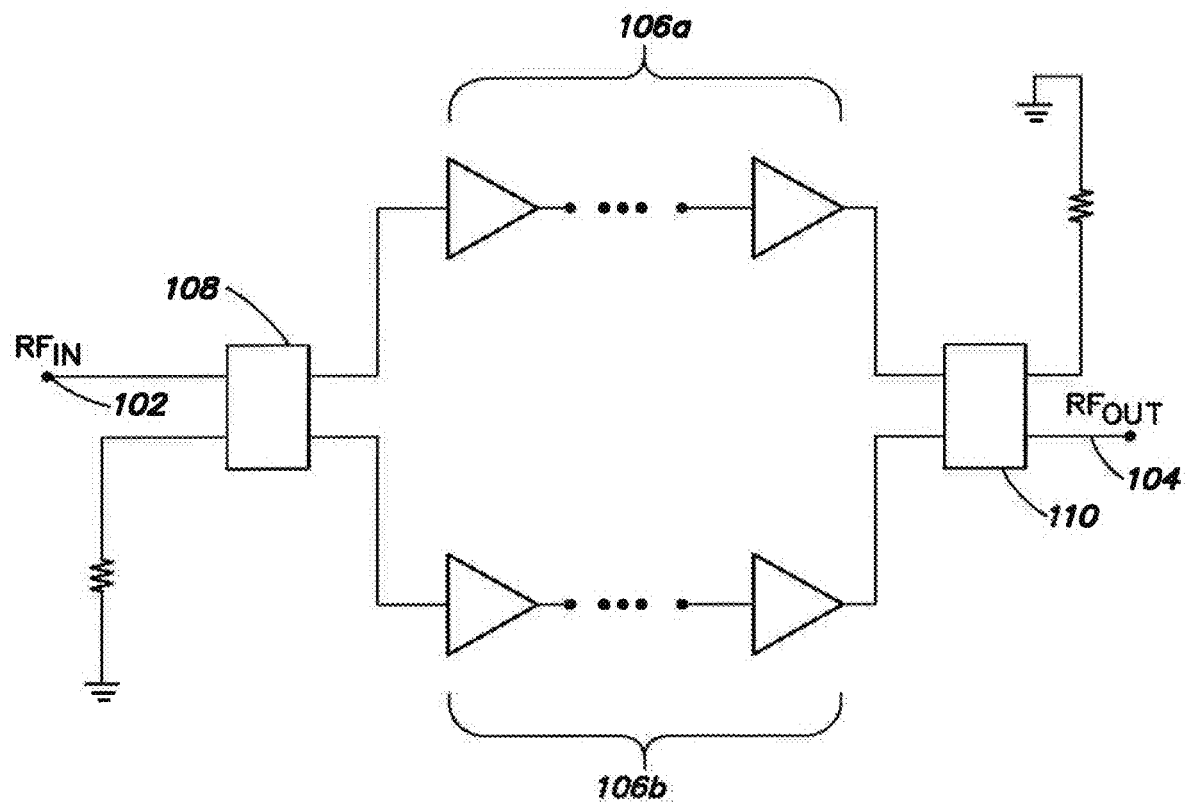
FIG. 1 is a block diagram of one example of a conventional balanced amplifier.
Figure 2:
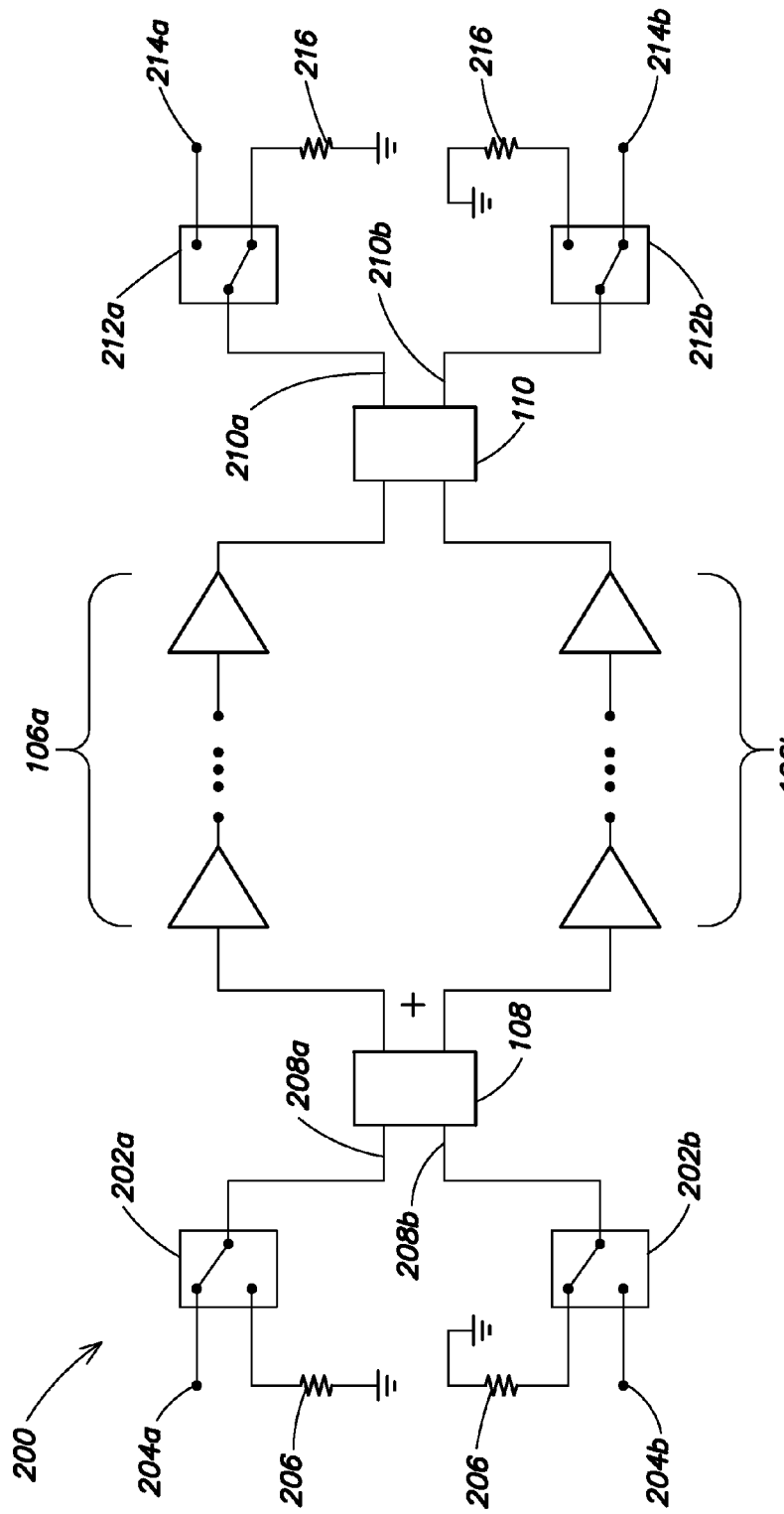
FIG. 2 is a block diagram of one example of a switchable balanced amplifier according to aspects of the invention.

Referring to FIG. 2, there is illustrated a block diagram of one example of a switchable balanced amplifier 200 according to aspects of the invention. In the illustrated example, the switchable balanced amplifier 200 includes a pair of input switches 202a and 202b, respectively coupled to the ports 208a and 208b of the input quadrature coupler 108. The first switch 202a is coupled to a first input port 204a and the second switch 202b is coupled to a second input port 204b. Different input signals to be amplified by the switchable balanced amplifier may be applied to the two input ports 204a and 204b. By selectively activating the input switches 202a, 202b, a selected one of the input ports 204a, 204b, and thus a corresponding selected one of the different input signals, may be coupled to the input quadrature coupler 108 and processed by the balanced amplifier chains 106a, 106b.

For example, input switch 202a can be configured to couple the signal applied at input port 204a to the port 208a of the input quadrature coupler 108 while input switch 202b is configured to disconnect input port 204b and couple port 208b of the input quadrature coupler 108 to a termination load 206. The switches 202a and 202b may be switched to alternatively couple the signal applied at input port 204b to the port 208b of the input quadrature coupler 108 and the port 208a of the input quadrature coupler to the termination load 206. In some applications, particularly where the switchable balanced amplifier is used in a communications system, the input signals may be radio frequency (RF) signals. However, it is to be appreciated that the invention is not so limited, and the input signals may be in any frequency band.

Similarly, the ports 210a and 210b of the output quadrature coupler 110 may be respectively coupled to one of a pair of output switches 212a and 212b. The first output switch 212a is coupled to a first output port 214a and to a termination load 216, and the second output switch 212b is coupled to a second output port 214b and to the termination load 216, as illustrated in FIG. 2. Selective actuation of the output switches 212a, 212b couples the output from the balanced amplifier chains 106a, 106b to one of the output ports 214a, 214b, while the other output port is connected to a termination load 216. It is to be appreciated that although the example amplifier illustrated in FIG. 2 comprises two single-pole double-throw switches coupled to each of the input quadrature coupler 108 and output quadrature coupler 110, the invention is not so limited and many other configurations and switching mechanisms are contemplated, as discussed further below.

Still referring to FIG. 2, in one example, the switches 202a and 202b are operated in tandem, preferably substantially simultaneously, such that at any given time during operation of the switchable balanced amplifier, only one input signal is coupled to the input quadrature coupler 108 and the other port of the input quadrature coupler is connected to the termination load 206. Similarly, the output switches 212a and 212b may be operated in tandem, preferably substantially simultaneously, so that the output signal from the balanced amplifier chains 106a, 106b is provided to one output port 214a or 214b, via a respective one of the ports 210a, 210b of the output quadrature coupler 110, while the other port of the output quadrature coupler is coupled to the termination load 216. Tandem actuation of the switches 202a, 202b (and/or 212a, 212b) may be achieved, for example, via a single control signal applied to both switches in the pair, or by actuating the switches under the control of a controller, such as a microprocessor.

The ability to switchably apply an input signal to either port 208a, 208b of the input quadrature coupler 108 and similarly to take the output signal from either port 210a, 210b of the output quadrature coupler 110, allows for multiple independent input and output signal paths through the switchable balanced amplifier 200. The input switches 202a, 202b and output switches 212a, 212b may be actuated independently or together. In one example, selection of one of the inputs 204a, 204b can be performed independently of selection of one of the outputs 214a, 214b. Thus, the amplified output signal corresponding to an input signal applied to input 204a may be directed to either output 214a or 214b, and likewise for the amplified output signal corresponding to an input signal applied to input 204b.

According to one embodiment, different output paths can be optimized such that different load lines and output power characteristics, and lower complexity antennae routing and filtering can be easily achieved. For example, for an amplifier that may be used in an RF transceiver, various output paths can be optimized for the specific requirements of various operating protocols, such as EDGE, GSM, WCDMA, etc., and/or operating frequency bands. As discussed above, conventional solutions for using a single balanced amplifier in multiple modes, operating frequency bands, power settings or applications can require complicated and lossy input and output path switching or load line switching, which undesirably adds to the size and complexity of the circuit. By contrast, the switchable balanced amplifier according to embodiments of the invention provides the ability to provide independent input/output paths for different input signals, which may have many advantages, including a reduction in complexity for multiple implementations of transceiver front end modules.

Referring again to FIG. 2, in one example, output port 214a can be coupled to circuitry (e.g., filtering circuitry, matching circuitry and other circuitry) specifically tailored for a particular operating protocol and frequency range, such as GSM, for example, while output port 214b is coupled to circuitry tailored to a different operating protocol and/or frequency range. Accordingly, different input signals provided at the different input ports 202a, 202b can be directed to appropriately configured output paths. For example, a GSM input signal provided at one of the input ports 202a, 202b can be directed to the appropriate output path at output port 214a. Similarly, the different input ports 202a, 202b can be coupled to different input circuitry, optimized for particular types of input signals. Thus, the switchable balanced amplifier can be considered a multi-mode balanced amplifier because independent input/output paths can be optimized for different modes of operation.

For example, the linearity specification for WCDMA applications presently requires switches with very large (wide band) linearity capabilities. Presently, physically large devices are required to meet this stringent linearity requirement. However, other applications may have lower linearity requirements. Using an example of the switchable balanced amplifier according to aspects of the invention, one output path can be optimized for WCMDA, separately and independently from the other output paths. Thus, when the switchable balanced amplifier is operating in WCMDA mode, an output can be provided from one output port (e.g., output port 214a) and be directed through a separate path to the antennae. If, for example, a switch is needed in this path, a specialized switch with dedicated performance tuned for the WCDMA mode can be used. In other modes, the switchable balanced amplifier can be configured to provide an output from another output port (e.g., output port 214b), which can have a separate (and optionally differently optimized) output path to the antennae. If a switch is also required in this output path, a switch with lower linearity can be used, thereby avoiding the parasitics and size overhead caused by a switch capable of meeting the more stringent WCMDA requirements. Thus, by providing different independent output paths for various different applications, performance in each path may be optimized for each application.

In one embodiment in which the input/output paths are specifically optimized for different types of signals, the input switches 202a, 202b and output switches 212a, 212b can be actuated together, such that selection of a particular input port 204a, 204b, and thus of a particular type of input signal, may automatically cause selection of the appropriate output port 214a or 214b. As discussed above, this type of dependent or tandem actuation of the input and output switches may be achieved under the control of a controller (such as a microprocessor or computer) or by using a common actuation signal applied to all switches.

Figure 3:
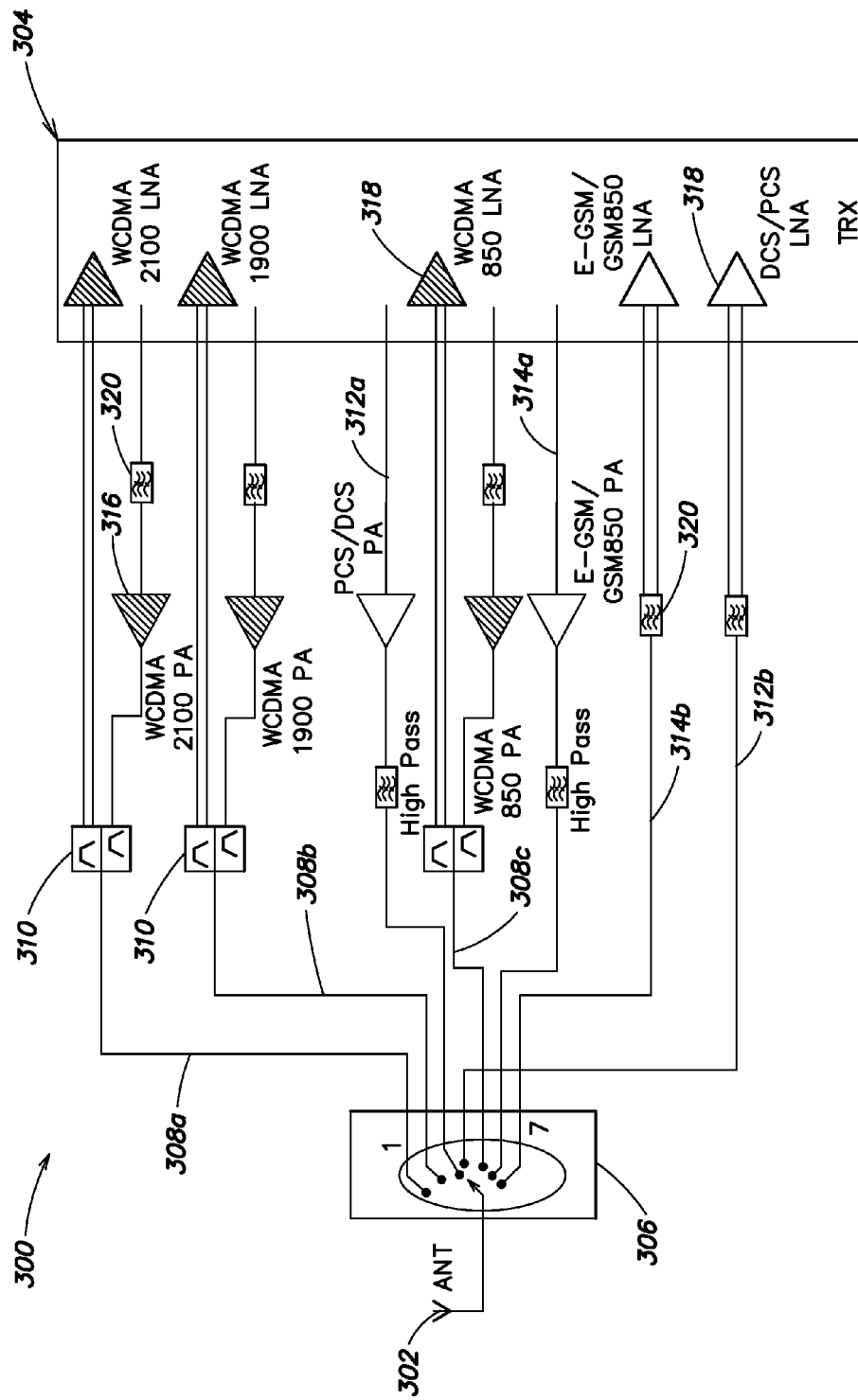
FIG. 3 is a block diagram of one example of a conventional communications system.

Referring to FIG. 3, there is illustrated a block diagram of one example of a conventional multi-standard communications system 300 configured for WCDMA in three different frequency bands, E-GSM and DCS/PCS applications. The communications system 300 includes an antenna 302 for transmitting and receiving signals, and a transceiver 304 for processing the received signals and the signals to be transmitted. Multiple signal paths are coupled between the antenna 302 and the transceiver 304 using a switch module 306 (which may be implemented in various ways, as known to those skilled in the art). In the illustrated example, the communications system 300 includes five different transmit paths and five different receive paths, namely, three WCDMA transmit and receive paths 308a, 308b, and 308c, which each includes a directional coupler 310 to separate the transmit and receive portions of the paths, a PCS/DCS transmit path 312a and receive path 312b, and an E-GSM transmit path 314a and receive path 314b. Accordingly, the conventional communications system includes five conventional balanced amplifiers 316, one for each transmit path 308a, 308b, 308c, 312a and 314a, which are used as power amplifiers in the transmit paths. The transceiver 304 also includes a low noise amplifier (LNA) 318 for each receive path. Filters 320 are also included in the various paths, as needed for each protocol and as known to those skilled in the art. As discussed above, each of the conventional balanced power amplifiers 316 includes a single input and single output, and therefore, a dedicated amplifier is required for each transmit path. Accordingly, for the five different applications supported by the conventional communications system illustrated in FIG. 3, five conventional power amplifiers 316 are needed to supply the five different output signals for transmission.

Figure 4:
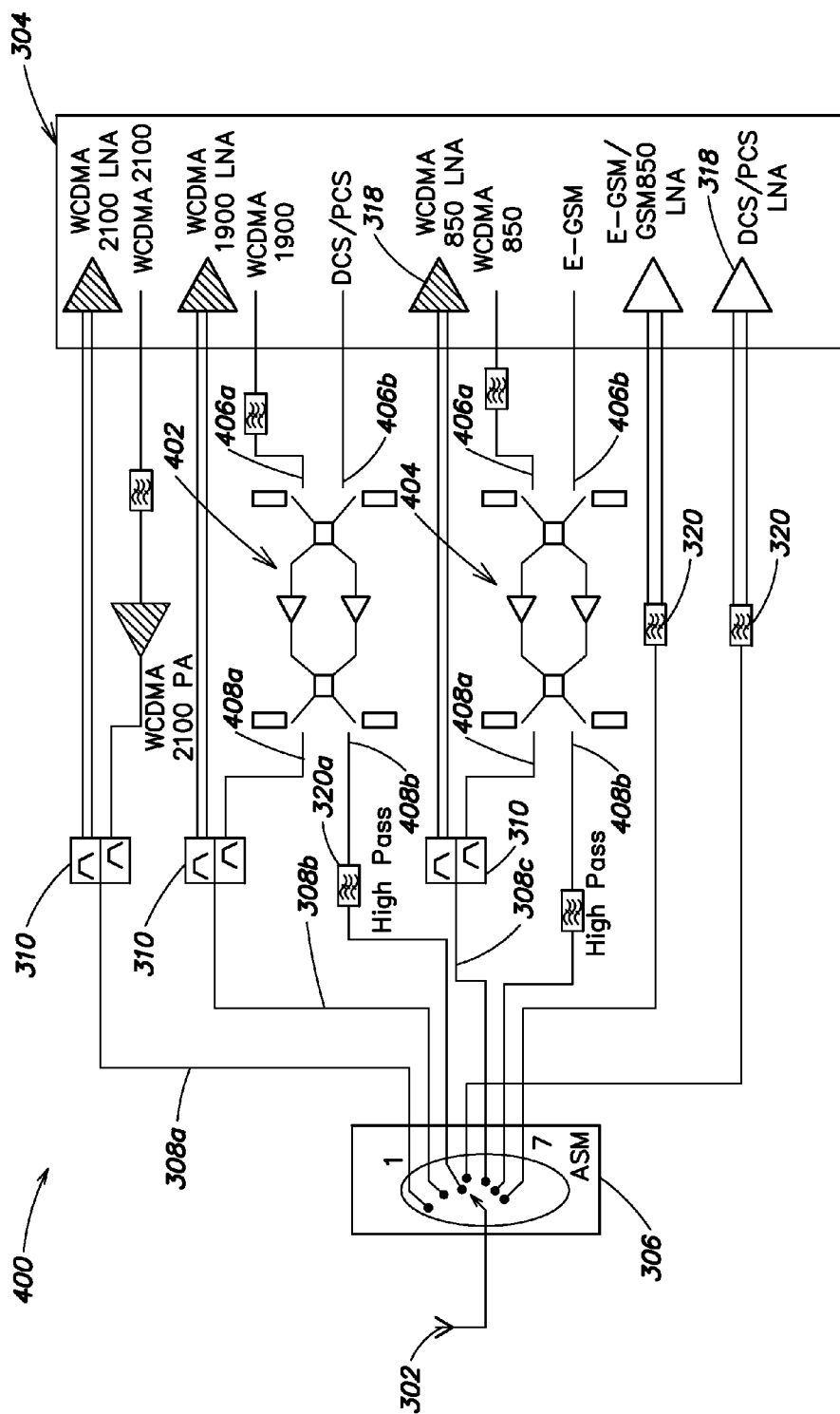
FIG. 4 is a block diagram of an example of a communications system incorporating switchable balanced amplifiers according to aspects of the invention.
Figure 5A:
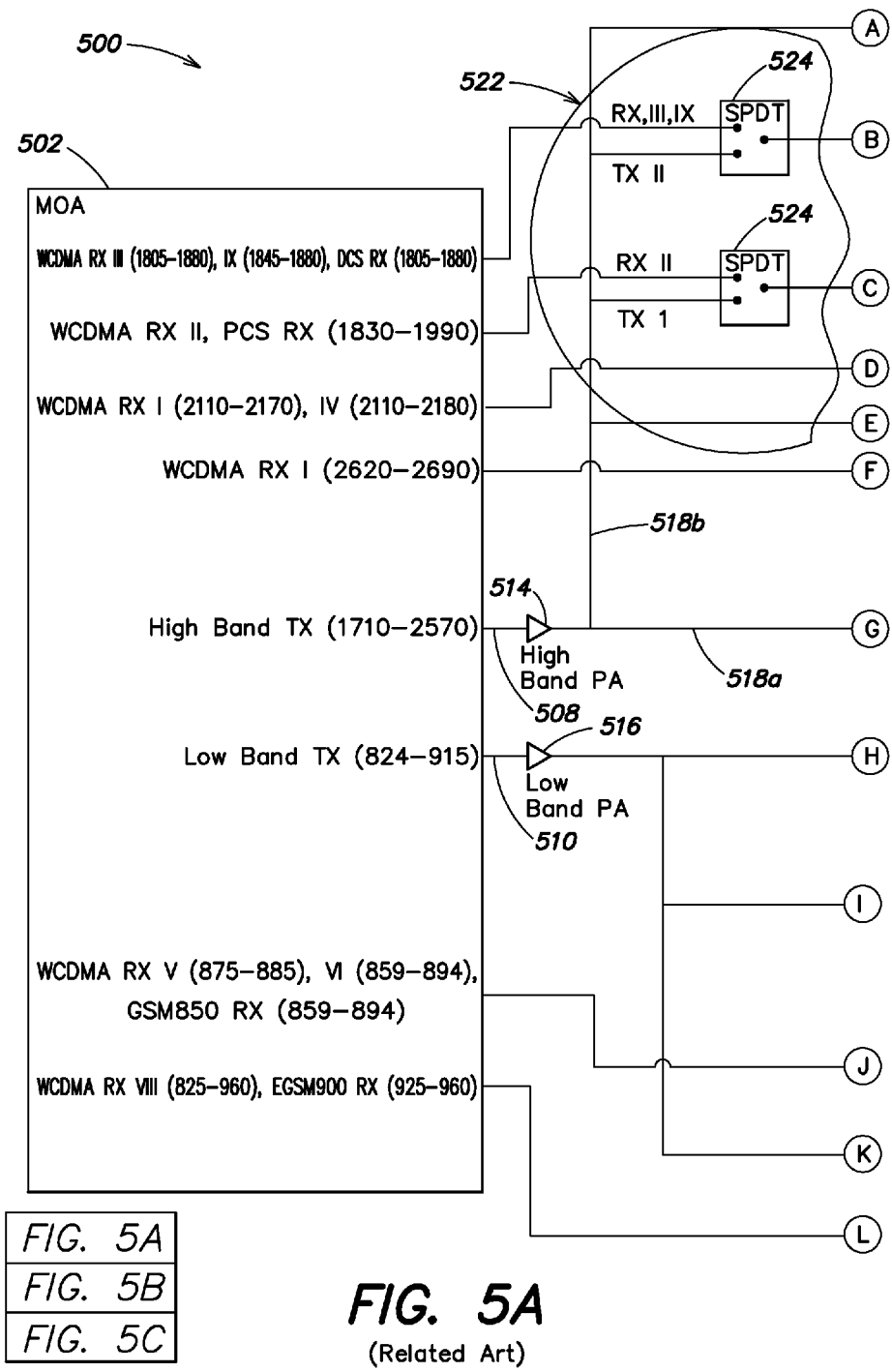
FIG. 5 is a block diagram of another example of a conventional communications system.
Figure 5B:
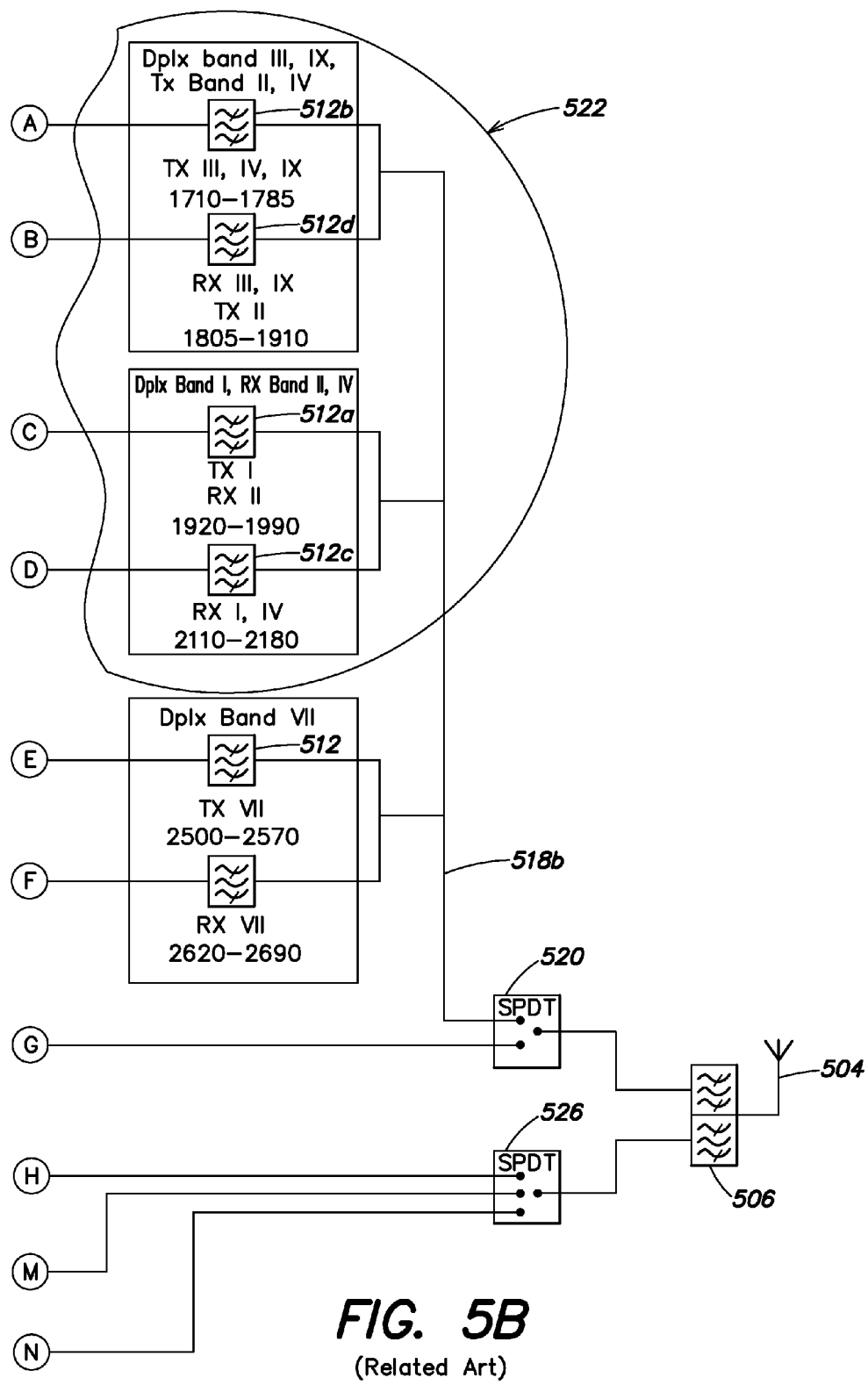
Figure 5C:
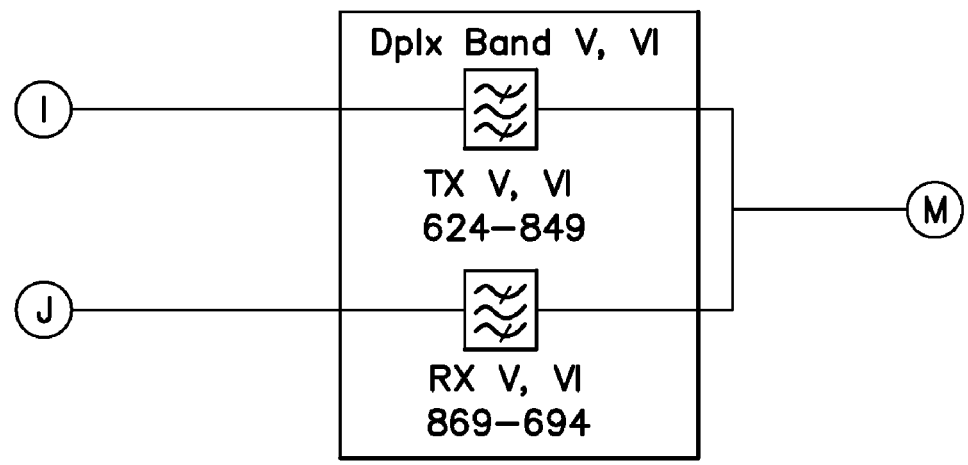
Figure 5C:
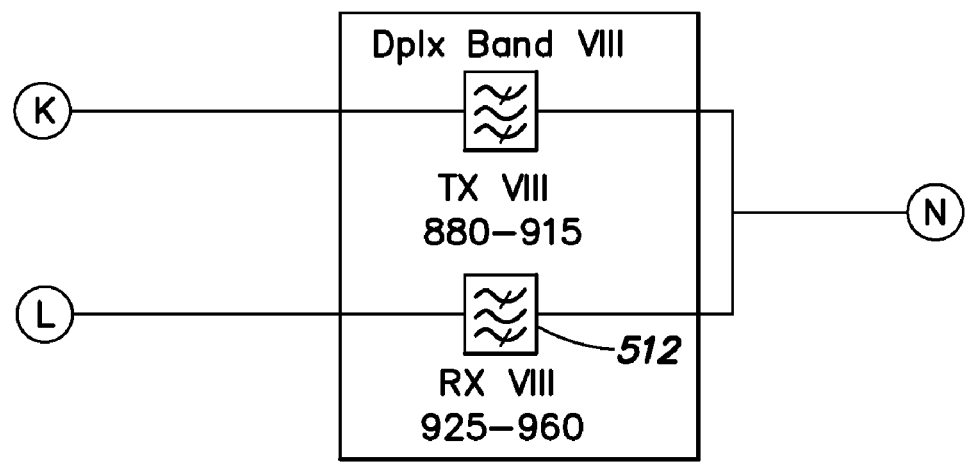

Referring to FIG. 4, there is illustrated a communications system 400 configured to support the same five applications (WCMDA at three different frequency bands, E-GSM and PCS/DCS) as the conventional communications system 300 illustrated in FIG. 3, but using switchable balanced amplifiers 200 according to aspects of the invention as the power amplifiers in the transmit channels. In the illustrated example, the communications system includes two switchable (multi-mode) balanced amplifiers 402, 404. However, it is to be appreciated that any number of switchable balanced amplifiers may be used depending on communications system configuration and the number of input and output paths desired. As discussed above, in one embodiment, each of the switchable balanced amplifiers 402, 404 includes two separate inputs 406a, 406b and two separate outputs 408a, 408b. Accordingly, each of the two switchable balanced amplifiers 402, 404 can provide two separate output signals. For example, in the example illustrated in FIG. 4, one of the WCDMA channels is coupled to the input 406a of the first switchable balanced amplifier 402 and passed via the output 408a to the directional coupler 310 in the WCDMA signal path 308b. The DCS/PCS transmit channel is coupled through the other input 406b and output 408b of the first switchable balanced amplifier 402, as shown. Similarly, the second switchable balanced amplifier 404 can be used in the transmit channels for another WCDMA signal and the E-GSM signal, as illustrated.

Thus, by using two switchable balanced amplifiers 402 and 404 for the power amplifiers in at least some of the transmit channels, the communications system 400 may require only three amplifiers to supply the five different transmit signals. By contrast, as discussed above, the conventional communications system 300 uses five conventional power amplifiers 316 to provide the five different transmit signals. Accordingly, by using the switchable balanced amplifiers 402, 404, the communications system 400 requires a reduced number of power amplifiers, which may reduce the size and cost of the system. Those skilled in the art will appreciate that one or more switchable balanced amplifiers may similarly be used to reduce the number of low noise amplifiers 318 used in the communications system 400.

Another example of how the switchable balanced amplifiers may be used to enhance performance of a communications system is illustrated with reference to FIGS. 5 and 6. FIG. 5 illustrates an example of a conventional communications system 500 configured for multi-mode, multi-band operation. The communications system 500 includes a transceiver module 502 that processes the signals to be transmitted and those received, and an antenna 504 that transmits and receives the signals. A diplexer 506 is used to switch the antenna between transmit and receive modes. In the illustrated example, the transceiver module generates a high-band transmit signal on line 508 and a low-band transmit signal on line 510. The various received signals are passed via band pass filters 512 to the transceiver module 502. The high-band transmit signal and low-band transmit signals are amplified by high-band and low-band power amplifiers 514, 516, respectively. The high-band transmit signal is split to provide two paths, 518a which is directly coupled to the diplexer 506, and 518b which is passed via the band pass filters 512 to the diplexer 506. A single-pole double-throw (SPDT) switch 520 is used to select either path 518a or path 518b. As illustrated in the area indicated by circle 522, the combination of the band pass filters 512a-d is set by the positions of two SPDT switches 524. The reuse of the band pass filters 512 among the transmit and receive channels enables diplexer functionality for at least some of the bands supported by the communications system 500. Similarly, the low-band signal is split into three paths, as illustrated, and a single-pole triple-throw (SPTT) switch 526 is used to select one path to be coupled to the antenna 504.

Figure 6A:
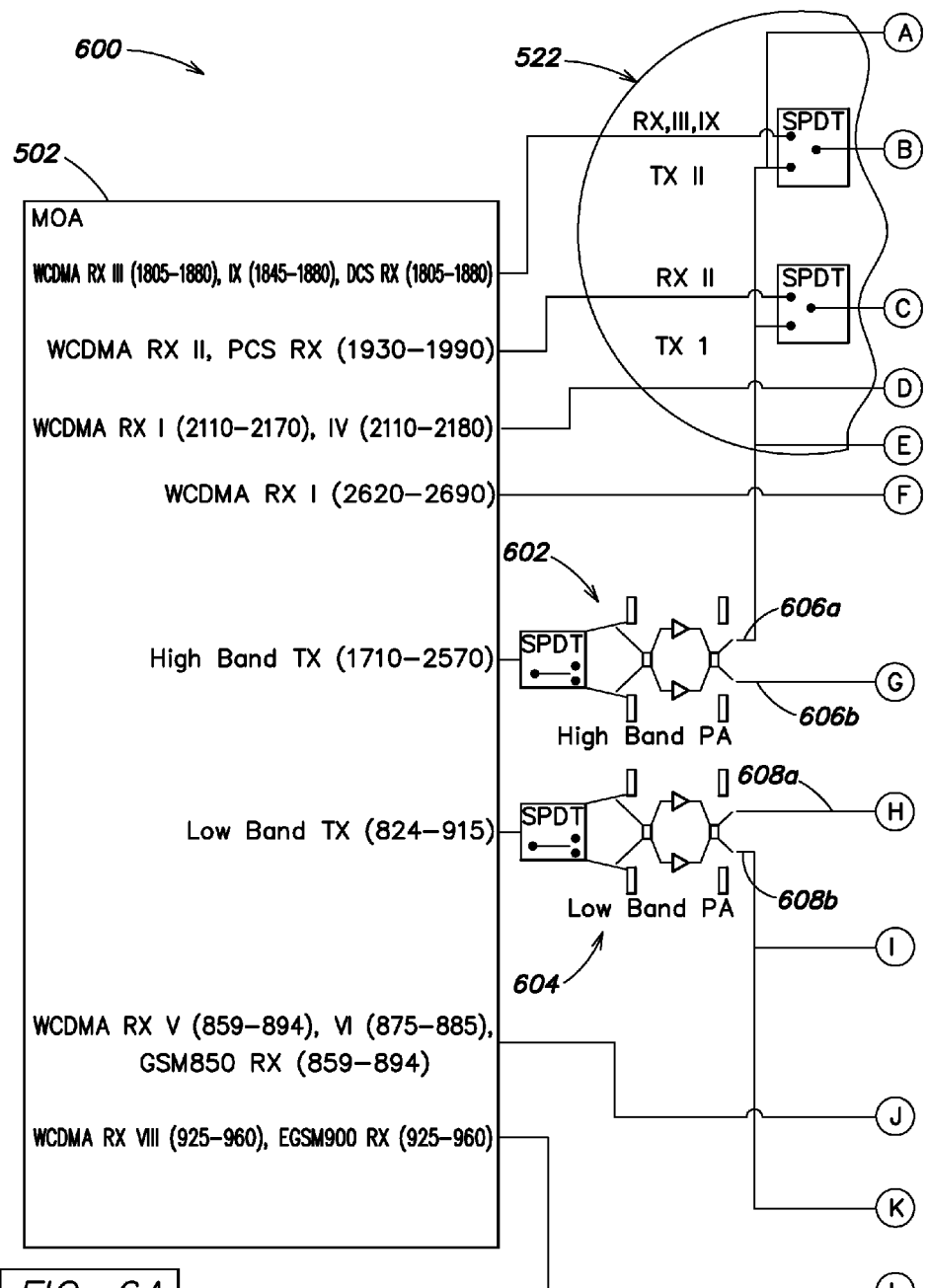
FIG. 6 is a block diagram of another example of a communications system incorporating switchable balanced amplifiers according to aspects of the invention.
Figure 6B:
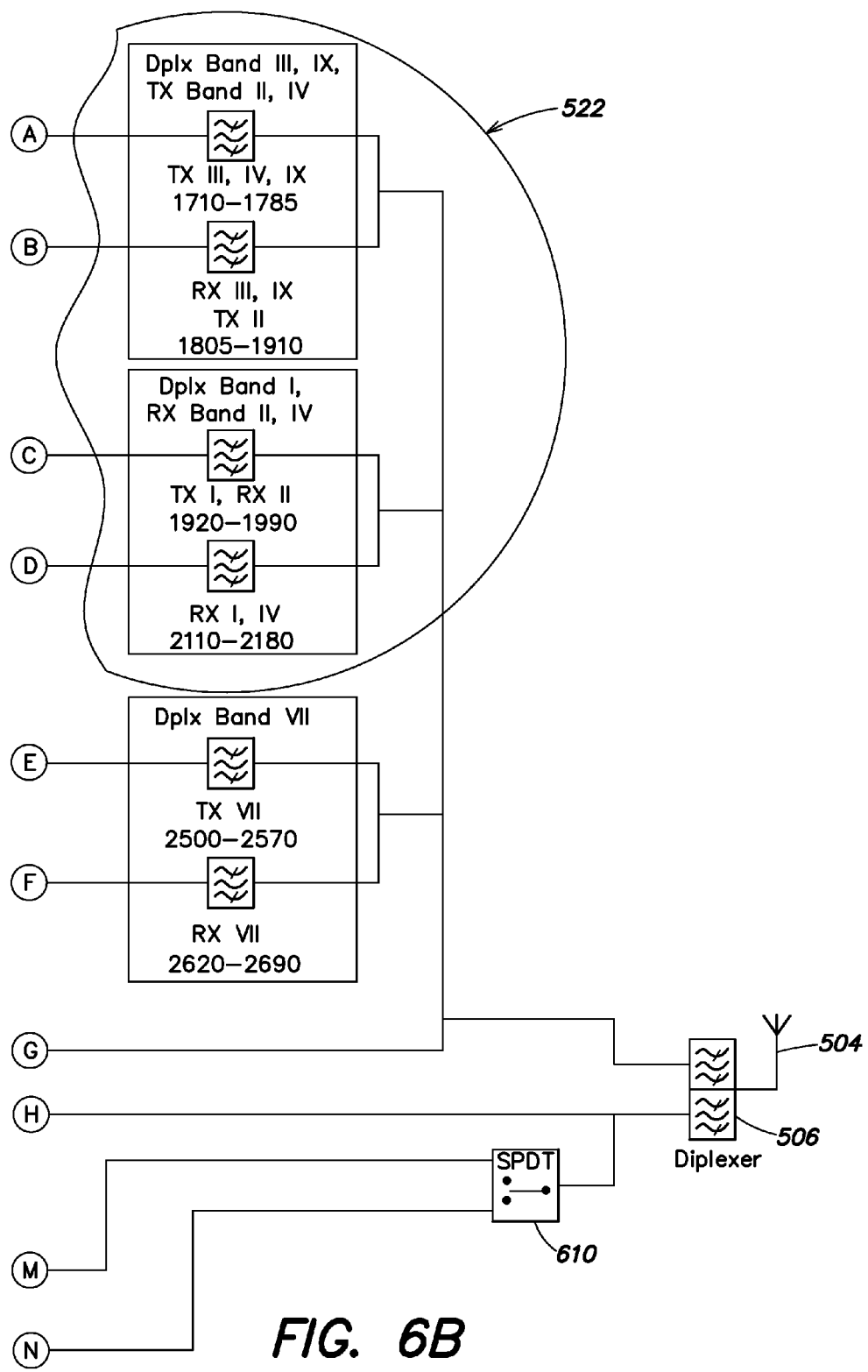
Figure 6C:
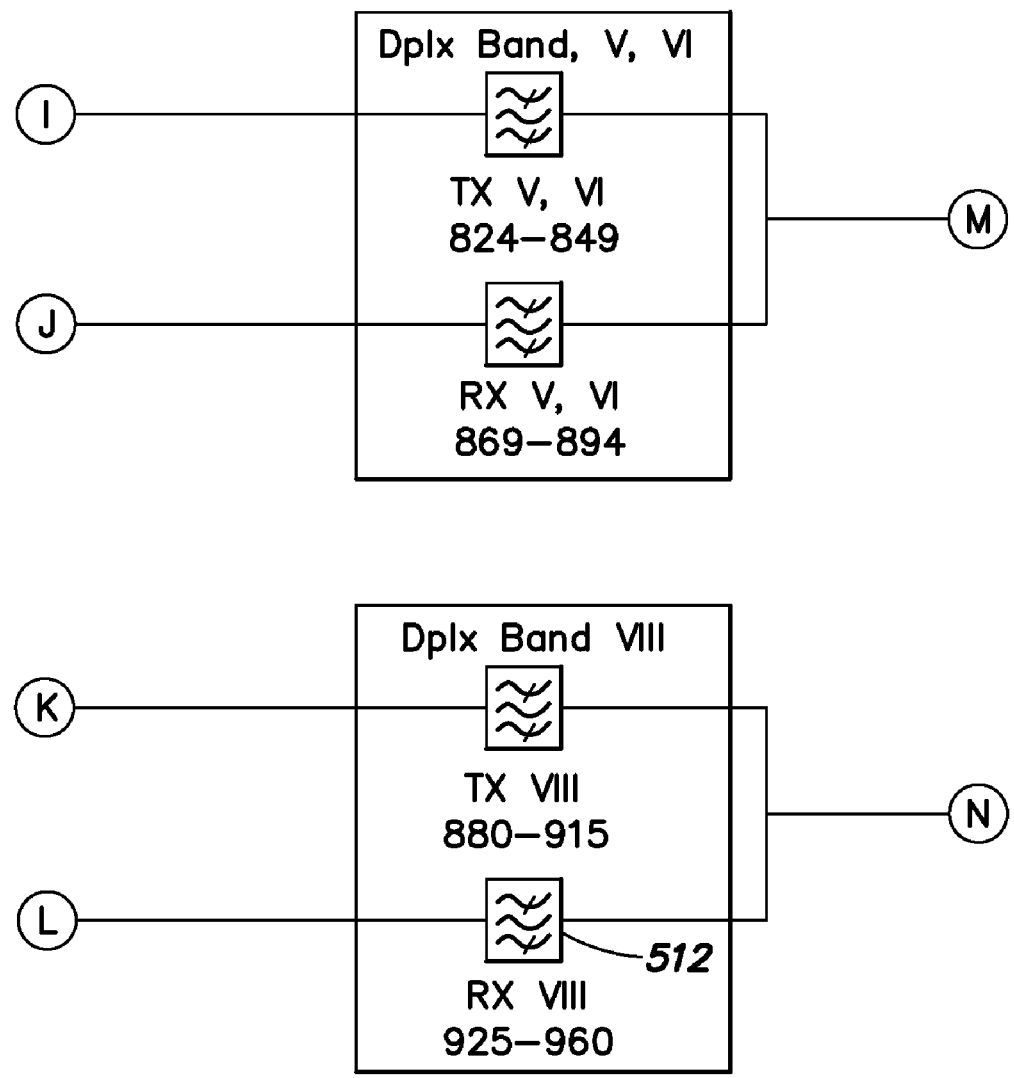

Referring to FIG. 6, there is illustrated a communications system 600, similar to the conventional communications system 500, that incorporates the use of switchable balanced amplifiers according to aspects of the invention. In the illustrated example, the high-band and low-band power amplifiers 514, 516 from FIG. 5 are replaced with switchable balanced amplifiers 602, 604, respectively. In this example, each of the switchable balanced amplifiers 602, 604 are configured to direct the input high-band and low-band signals, respectively, to one of the two inputs of the respective switchable balanced amplifiers and to connect the other input of each amplifier to a termination load, as discussed above with reference to FIG. 2. However, it is to be appreciated that the invention is not so limited and any of various embodiments of the switchable balanced amplifier may be used.

Still referring to FIG. 6, in one embodiment, the first switchable balanced amplifier 602 is used to direct the high-band transmit signal either through the band pass filters 512 to the diplexer 506, via output port 606a, or directly to the diplexer via output port 606b. Because the switching between the two paths available to the high-band transmit signal is done by the switchable balanced amplifier 602, the SPDT switch 520 used in the conventional system 500 (see FIG. 5) may be eliminated. Similarly, the second switchable balanced amplifier 604 may be used to direct the low-band transmit signal either directly to the diplexer 506, via output port 608a, or through the band pass filters 512 via output port 608b. Accordingly, because some of the path selection for the low-band transmit signal is done by the second switchable balanced amplifier 604, the SPTT switch 526 used in the conventional system 500 (see FIG. 5) may be replaced with an SPDT switch 610. The SPDT switch 610 is used to select between the two band pass filter paths available to the low-band transmit signal, as illustrated in FIG. 6. By using the switchable balanced amplifiers 602, 604, the communications system 600 eliminates the need for high-band switching with SPDT switch 520 and reduces the number of poles required in the low-band switch. In contrast, the conventional communications system 500 requires SPDT switch 520 for high-band switching and SPTT switch 526 for low-band switching.

Figure 7:
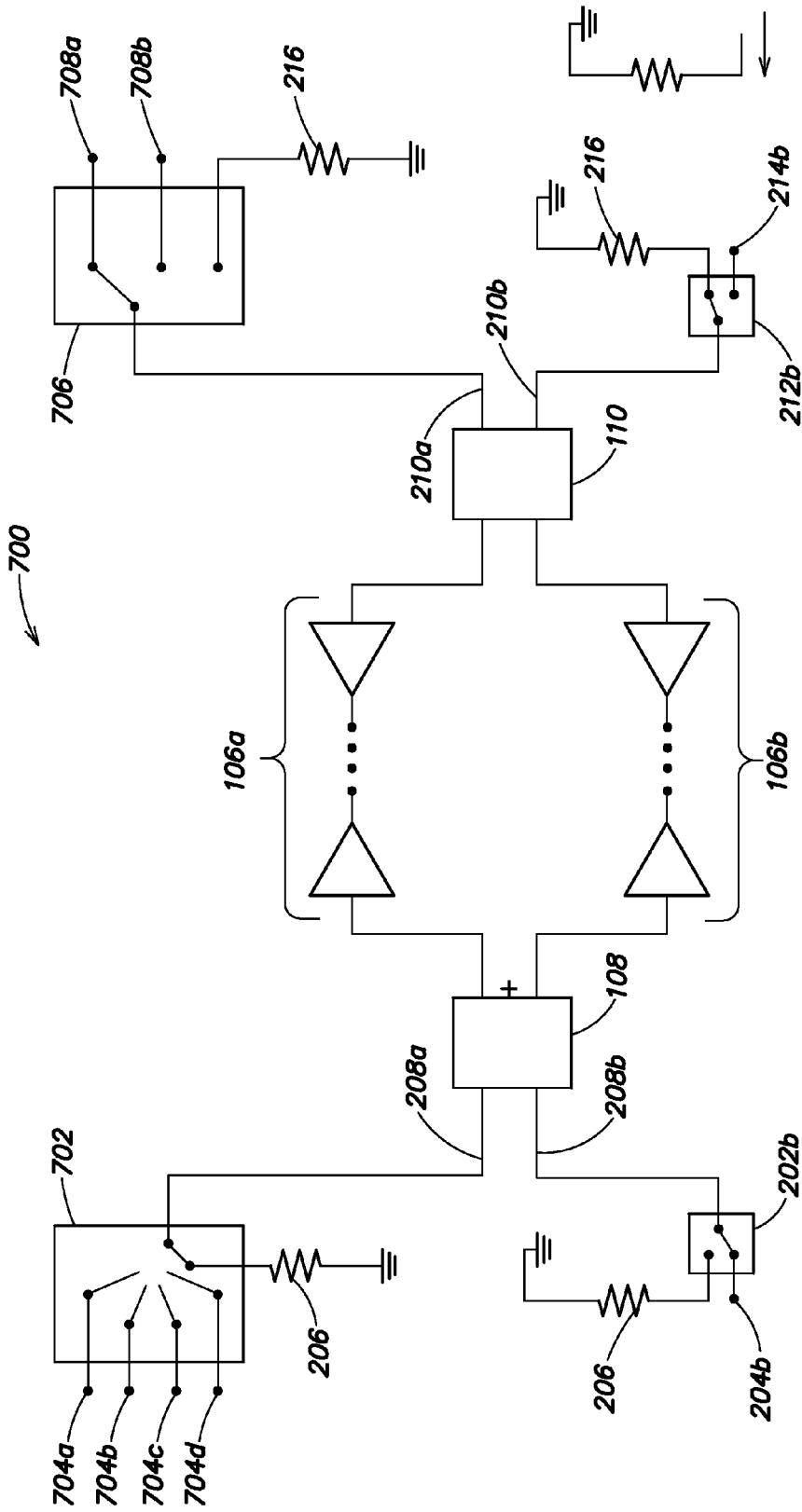
FIG. 7 is a block diagram of another example of a switchable balanced amplifier according to aspects of the invention.

In the examples of the switchable balanced amplifiers illustrated in FIG. 2, the input and/or output switches 202a, 202b, 212a and 212b are single-pole double-throw (SPDT) switches. Accordingly, each switchable amplifier 200 is capable of two different inputs and two different outputs. However, it is to be appreciated that the invention is not so limited. Any of the SPDT switches may be replaced with switches, or switching modules, capable of switching between any number of inputs or outputs. These switches or switching modules may include, for example, SPTT switches, multi-pole-multi-throw switches, switching modules such as the switching module 306 illustrated in FIGS. 3 and 4, multiplexers, couplers, or other switching devices known to those skilled in the art. Furthermore, the number of available inputs need not match the number of available outputs. For example, referring to FIG. 7, there is illustrated an example of a modified switchable balanced amplifier 700 in which one of the input switches (switch 202a in FIG. 2) has been replaced with a multi-input switching module 702 that allows one of multiple inputs 704a-d and a termination load 206 to be selectively coupled to the port 208a of the input quadrature coupler 108. One of the output switches (switch 214a in FIG. 2) has been replaced with an SPTT switch 706 that allows the output signal from the amplifier chains 106a, 106b to be directed, via the port 210a of the output quadrature coupler 110, to any of two output ports 708a, 708b or to a termination load 216. It is to be appreciated that any of the input switches 202a, 202b or output switches 212a, 212b in FIG. 2 may be replaced with any other type of switch or switching module having any number of connections to inputs or outputs, not limited to the configuration shown in FIG. 7. Furthermore, it is to be appreciated that the two input switches 202a, 202b may be condensed into a single input switch, or switching module configured to direct a selected one of one or more input signals to one of the ports 208a or 208b of the input quadrature coupler 108. Similarly, the output switches 212a, 212b may be condensed into a single output switch or switching module.

Figure 8:
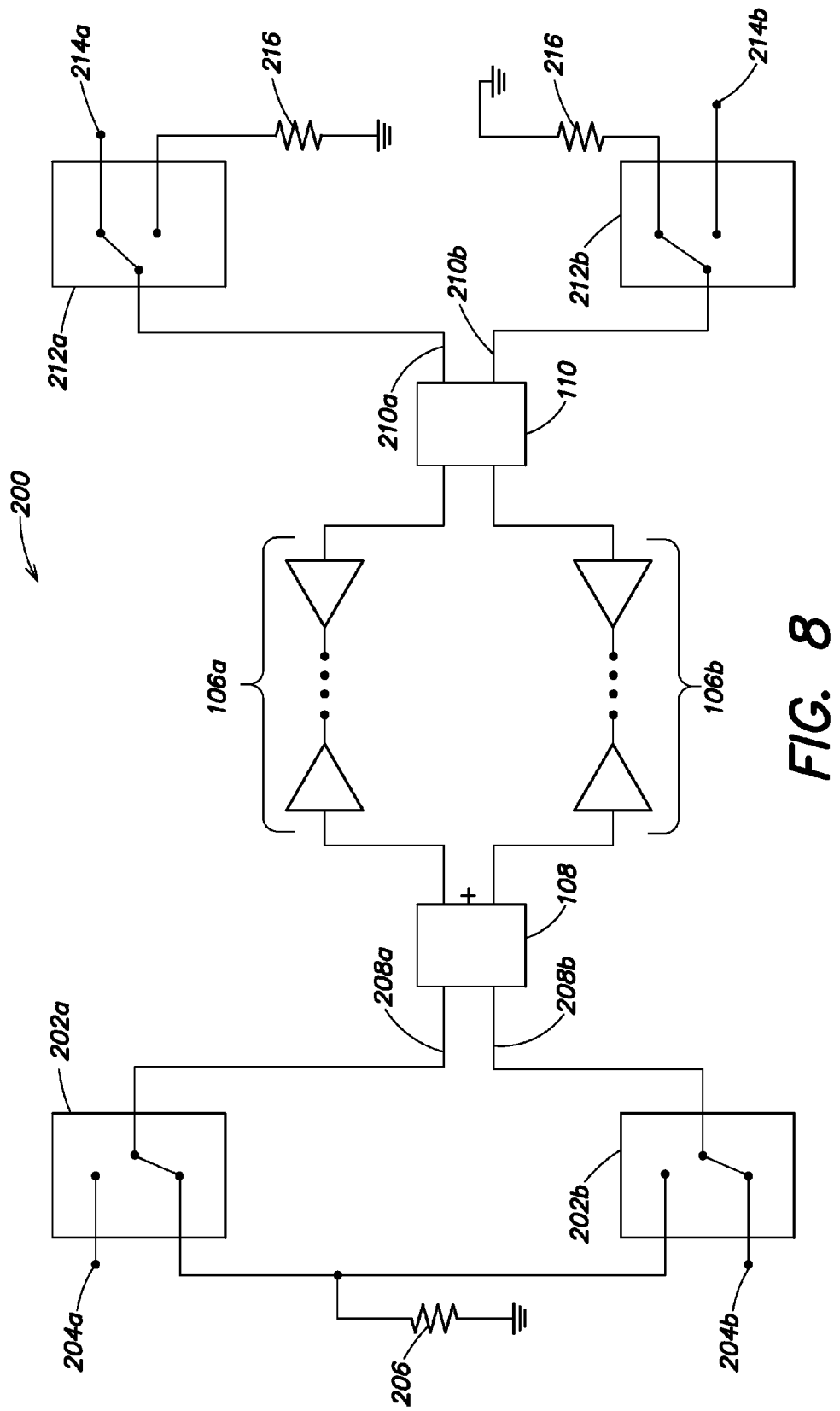
FIG. 8 is a block diagram of another example of a switchable balanced amplifier according to aspects of the invention.

In addition, in another example, the input switches 202a, 202b can be configured such that they share a termination load 206, as illustrated in FIG. 8, so as to reduce the size of the switchable balanced amplifier module. Although not shown in FIG. 8, the output switches 212a, 212b may be similarly configured to share a common termination load 216, also to reduce module size. The output switches 212a, 212b may also include coupler detector circuitry to reduce module size in applications that require power detection. In another example configuration, the two input switches 202a, 202b can be connected to a common input signal port, such that a single input signal may be routed to either port 208a or port 208b of the input quadrature coupler 108.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A switchable balanced amplifier comprising:
an input quadrature coupler having a first port switchably connected to one of an input termination load and at least one first input signal terminal, and a second port switchably connected to one of the input termination load and at least one second input signal terminal;
an output quadrature coupler having a first port switchably connected to one of an output termination load and at least one first output signal terminal, and a second port switchably connected to one of the output termination load and at least one second output signal terminal; and
an amplifier stage electrically coupled between the input quadrature coupler and the output quadrature coupler.

2. A switchable balanced amplifier comprising:
an input quadrature coupler having a first port and a second port, each of the first and second ports of the input quadrature coupler switchably connected to one of an input termination load and at least one input signal terminal;
an output quadrature coupler having a first port and a second port, each of the first and second ports of the output quadrature coupler switchably connected to one of an output termination load and one of a plurality of output signal terminals; and
an amplifier stage electrically coupled between the input quadrature coupler and the output quadrature coupler.

3. The switchable balanced amplifier of claim 2 wherein each of the first and second ports of the input quadrature coupler are switchably connected to one of the input termination load and the at least one input signal terminal by respective first and second input switches.

4. The switchable balanced amplifier as claimed in claim 3, wherein the first and second input switches are single-pole double-throw switches.

5. A switchable balanced amplifier comprising:
an input quadrature coupler having a first port and a second port, each of the first port and the second port of the input quadrature coupler is switchably connected to one of an input termination load and one of a plurality of input signal terminals;
an output quadrature coupler having a first port and a second port, each of the first port and the second port of the output quadrature coupler switchably connected to one of an output termination load and at least one output signal terminal; and
an amplifier stage electrically coupled between the input quadrature coupler and the output quadrature coupler.

6. The switchable balanced amplifier of claim 5 further comprising input switching means configured to switchably connect the first and second ports of the input quadrature coupler to one of the input termination load and the one of the plurality of input signal terminals.

7. A switchable balanced amplifier comprising:
an input quadrature coupler having a first port and a second port, each of the first and second ports of the input quadrature coupler being switchably connected to one of an input termination load and at least one input signal terminal;
an output quadrature coupler having a first port and a second port, each of the first and second ports of the output quadrature coupler being switchably connected to one of an output termination load and at least one output signal terminal; and
an amplifier stage electrically coupled between the input quadrature coupler and the output quadrature coupler the at least one input signal terminal that is switchably connected to the first port of the input quadrature coupler being electrically coupled to first input circuitry optimized for a first operating mode and the at least one input signal terminal that is switchably connected to the second port of the input quadrature coupler being electrically coupled to second input circuitry optimized for a second operating mode that is different than the first operating mode.

8. The switchable balanced amplifier of claim 5 wherein each of the first and second ports of the output quadrature coupler are switchably connected to one of the output termination load and the at least one output signal terminal by respective first and second output switches.

9. The switchable balanced amplifier as claimed in claim 8, wherein the first and second output switches are single-pole double-throw switches.

10. The switchable balanced amplifier of claim 5 further comprising output switching means configured to switchably connect each of the first and second ports of the output quadrature coupler to one of the output termination load and the at least one output signal terminal.

11. The switchable balanced amplifier of claim 10, wherein the at least one output signal terminal includes a plurality of output signal terminals and the output switching means is configured to connect one of the first and second ports of the output quadrature coupler to the output termination load and the other of the first and second ports of the output quadrature coupler to one of the plurality of output signal terminals.

12. The switchable balanced amplifier of claim 11, wherein the plurality of output signal terminals includes a first output signal terminal and a second output signal terminal, the first signal terminal is coupled to first output circuitry optimized for a first operating mode, and the second signal terminal is coupled to second output circuitry optimized for a second operating mode that is different than the first operating mode.

13. A switchable balanced amplifier comprising:
an input quadrature coupler having a first port and a second port, each of the first and second ports of the input quadrature coupler being switchably connected to one of an input termination load and at least one input signal terminal;
an output quadrature coupler having a first port and a second port, each of the first and second ports of the output quadrature coupler being switchably connected to one of an output termination load and at least one output signal terminal; and
an amplifier stage electrically coupled between the input quadrature coupler and the output quadrature coupler, the at least one output signal terminal that is switchably connected to the first port of the output quadrature coupler being electrically coupled to first output circuitry optimized for a first operating mode, and the at least one output signal terminal that is switchably connected to the second port of the output quadrature coupler being electrically coupled to second output circuitry optimized for a second operating mode that is different than the first operating mode.

14. A method of configuring a balanced amplifier, the method comprising:
switchably connecting each of a first input port of the balanced amplifier and a second input port of the balanced amplifier to one of an input termination load and a selected one of a plurality of input signal terminals; and
switchably connecting each of a first output port of the balanced amplifier and a second output port of the balanced amplifier to one of an output termination load and at least one output signal terminal.

15. The method as claimed in claim 14, wherein the at least one output signal terminal includes a plurality of output signal terminals; and
wherein switchably connecting each of the first and second output ports of the balanced amplifier to one of the output termination load and the at least one output signal terminal includes:
selecting one of the plurality of output signal terminals; and
switchably connecting each of the first and second output ports of the balanced amplifier to one of the output termination load and the selected one of the plurality of output signal terminals.

16. The method as claimed in claim 15, wherein selecting one of the plurality of output signal terminals is performed responsive to switchably connecting each of the first and second input ports of the balanced amplifier to one of the input termination load and the selected one of the plurality of input signal terminals.

17. The method as claimed in claim 15, wherein selecting one of the plurality of output signal terminals is performed responsive to selecting one of the plurality of input signal terminals.

18. The method as claimed in claim 14, wherein switchably connecting each of the first and second output ports of the balanced amplifier to one of the output termination load and the at least one output signal terminal is performed responsive to switchably connecting each of the first and second input ports of the balanced amplifier to one of the input termination load and the selected one of the plurality of input signal terminals.

19. The method as claimed in claim 14, wherein
switchably connecting each of the first input port of the balanced amplifier and the second input port of the balanced amplifier to one of the input termination load and the selected one of the plurality of input signal terminals includes switchably connecting the first input port of the balanced amplifier to the input termination load and switchably connecting the second input port of the balanced amplifier to the selected one of the plurality of input signal terminals; and
wherein switchably connecting each of the first output port of the balanced amplifier and the second output port of the balanced amplifier to one of the output termination load and the at least one output signal terminal includes switchably connecting the first output port of the balanced amplifier to the output termination load and switchably connecting the second output port of the balanced amplifier to the at least one output signal terminal.

20. The switchable balanced amplifier of claim 1 further comprising:
a first input switch configured to switchably connect the first port of the input quadrature coupler to one of the input termination load and the at least one first input signal terminal; and
a second input switch configured to switchably connect the second port of the input quadrature coupler to one of the input termination load and the at least one second input signal terminal.

21. The switchable balanced amplifier of claim 1 further comprising:
first input circuitry optimized for a first operating mode and electrically coupled to the first input signal terminal; and
second input circuitry optimized for a second operating mode, different than the first operating mode, and electrically coupled to the second input signal terminal.

22. The switchable balanced amplifier of claim 1 further comprising:
a first output switch configured to switchably connect the first port of the output quadrature coupler to one of the output termination load and the at least one first output signal terminal; and
a second output switch configured to switchably connect the second port of the output quadrature coupler to one of the output termination load and the at least one second output signal terminal.

* * * * *